United States Patent [19]
Cummings et al.

[11] 4,336,320
[45] Jun. 22, 1982

[54] PROCESS FOR DIELECTRIC STENCILED MICROCIRCUITS

[75] Inventors: John P. Cummings, Bloomington; Janice D. Makos, Apple Valley; David E. Pitkanen, St. Louis Park, all of Minn.

[73] Assignee: Honeywell Inc., Minneapolis, Minn.

[21] Appl. No.: 243,176

[22] Filed: Mar. 12, 1981

[51] Int. Cl.³ .............................................. G03C 7/00
[52] U.S. Cl. ................................... 430/198; 430/317; 430/330; 427/96
[58] Field of Search ............... 430/198, 313, 330, 331, 430/317; 156/272

[56] References Cited
U.S. PATENT DOCUMENTS

| | | | |
|---|---|---|---|
| 3,443,944 | 5/1969 | Wise | 430/198 |
| 3,982,941 | 9/1976 | Inskip | 430/198 |
| 4,119,480 | 10/1978 | Nishi et al. | 430/319 |

*Primary Examiner*—L. Travis Brown
*Attorney, Agent, or Firm*—Omund R. Dahle

[57] ABSTRACT

The present invention is directed to a process for complex, high density microcircuits in which thick film dielectric pastes are photolithography patterned into high resolution stencils to produce complementary conductor circuitry patterns, the voids of the developed dielectric stencil are filled with thick film conductor paste, and then there is a cofiring of the conductor and the dielectric. With this new process the number of separate firing operations is reduced. The reduction in the number of firings is important in multilevel hybrid structures.

14 Claims, 6 Drawing Figures

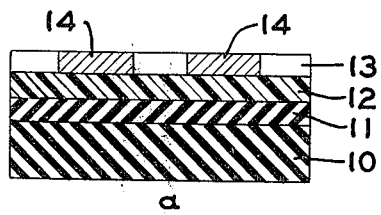
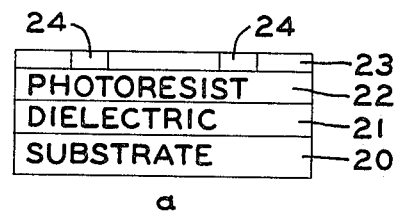
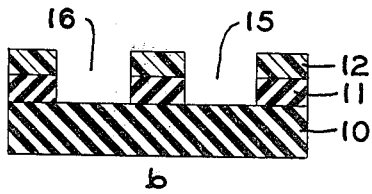
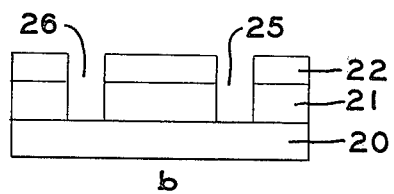
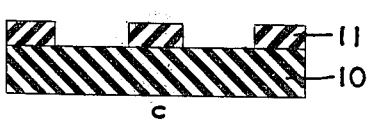
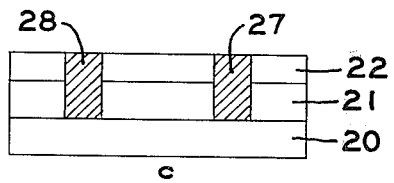
PRIOR ART
*Fig. 1*
*Fig. 2*
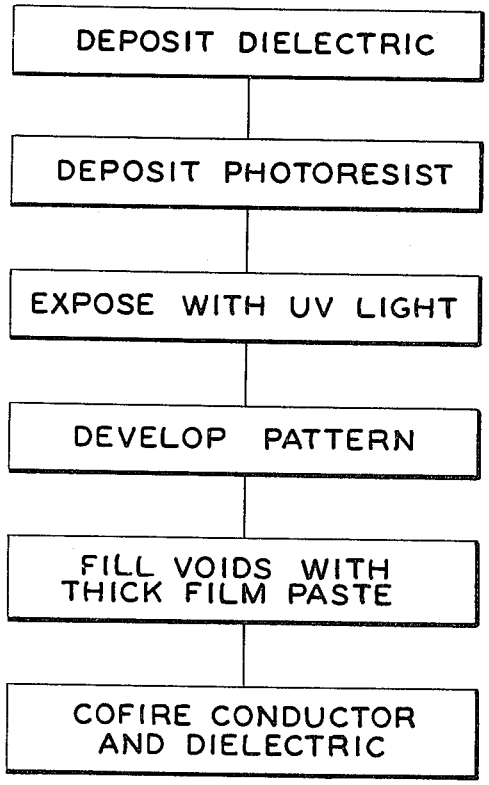
*Fig. 3*

PROCESS FOR DIELECTRIC STENCILED MICROCIRCUITS

BACKGROUND AND SUMMARY OF THE INVENTION

In the prior art, as shown in FIG. 1, it is known to coat an insulating paste 11 on a ceramic substrate 10, dry the paste to evaporate the thinners, deposit a photosensitive resin 12 on the insulating layer, dry the layer 12, placed a patterned lithographic mask 13 over the surface, expose with UV through openings 14, develop and remove portions of the layers 12 and 11 and fire the assembly resulting in the structure of FIG. 1c. Such a teaching may be found in U.S. Pat. No. 4,119,480.

The present invention is directed to a process for complex, high density microcircuits in which thick film dielectric pastes are photolithography patterned into high resolution stencils to produce complementary conductor circuitry patterns, the voids of the developed dielectric stencil are filled with thick film conductor paste, and then there is a cofiring of the conductor and the dielectric. With this new process the number of separate firing operations is reduced. The reduction in the number of firings is important in multilevel hybrid structures because material interactions are reduced since they are related to the number of firings. Registration is maintained since it too is a function of number of firings. The dielectric stencil approach minimizes the conductor paste rheology contraints because the conductor paste is contained in the dielectric voids.

BRIEF DESCRIPTION OF THE DRAWINGS

FIG. 1 is a showing of prior art.

FIG. 2 a, b and c is a diagrammatic presentation according to the invention.

FIG. 3 is a block diagram presentation of the process steps.

DESCRIPTION

Figure 4:
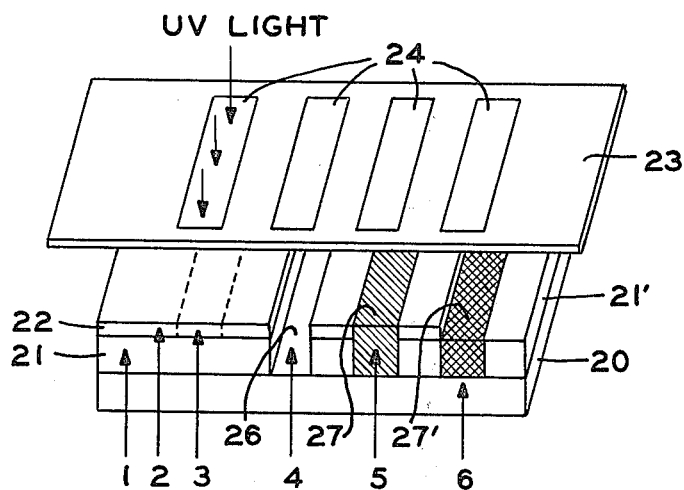
FIGS. 4, 5 and 6 are composite progressive pictorial views of a number of process steps of the invention.

Technology advances made by the development of very large scale integrated (VLSI) electronic components have created a need for complex, high density interconnection circuitry for both chip carriers and multilayer hybrid micropackages. Screen printing can no longer meet the fine line (2-4 mil) resolution pattern requirements and therefore new methods of photopatterning thick film pastes are being developed making possible the required high density packaging. There is described below a novel process for producing high density thick-film hybrids by photolithography patterning of dried but unfired dielectric layers into high resolution stencils to produce complementary conductor circuitry patterns with a minimum of firing steps.

Referring now to FIG. 2 there is shown a substrate 20, such as ceramic, having deposited thereon a dielectric thick-film paste 21. Examples of dielectric pastes which have been used are DuPont's 4175 dielectric and DuPont's 4275 dielectric which form dense dielectrics. The dielectric layer 21 is deposited and dried at room temperature. Over the dried dielectric layer 21 is deposited a polymer photoresist layer 22. After the photoresist layer has dried it is ready to be exposed to ultraviolet (UV) light through a suitable photolithography mask 23. In FIG. 2a the mask is shown as having openings 24 which correspond to the fine line circuits it is desired to fabricate. Although the steps of depositing and drying the dielectric and depositing and drying photoresist have been described as separate steps, if a suitable insulating dielectric paste containing a photosensitive vehicle becomes available, these two steps may be combined into a single step. The fine line circuits may be on the order of 2-2 mils wide. Following the exposure of UV, the photoresist layer 22 is treated with a developing solution for that type of photoresist. The solution is chosen for the simultaneous etching of the dielectric layer 21, as is shown in FIG. 2b to form the voids 25 and 26 of the dielectric stencil. The voids are then filled, as shown in FIG. 2c, with either an air-fireable noble metal conductor paste or nitrogen-fireable non-noble metal paste such as copper conductive paste 27 and 28 which becomes the thick film conductors. A cofiring of the dielectric 21 and the conductors 27 and 28 is then accomplished at the temperature range of about 800° C. to about 1000° C. in a suitable conveyor furnace to form both the dielectric level and the conductor lines or vias.

FIG. 3 shows the process steps of (1) depositing the dielectric, (2) depositing the photoresist, (3) exposing with UV light, (4) developing the pattern through the photoresist and the dielectric, (5) filling the voids in the dielectric with the thick film conductive paste and (6) cofiring the dielectric and conductor pastes. This improved process improves pattern resolution and performance properties of high-density thick-film circuits. It decreases the number of processing steps and high temperature firings. It also reduces hybrid multilayer circuit cost by eliminating patterning of conductors, by removing only dielectric film, by permitting cofiring of dielectric and conductor and the process is suitable for noble or base metal conductor materials.

Figure 5:
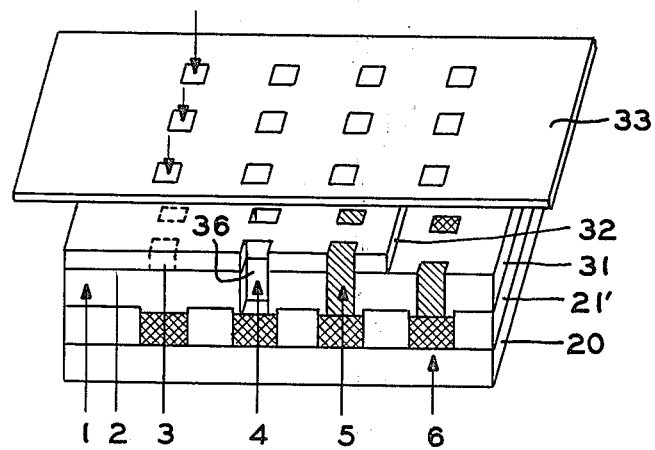
Figure 6:
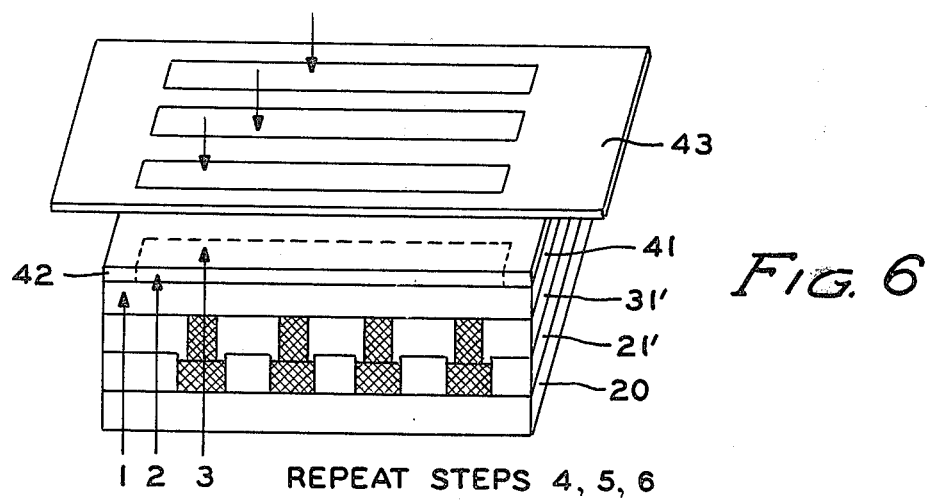

FIGS. 4, 5 and 5 are pictorial views of the processing steps described above in connection with FIGS. 2 and 3 for the process of fabricating or making the multilayer fine line circuit. The same identifying numerals are used in FIG. 4 as in FIG. 2 where practical, and the single digit numerals in FIG. 4 relate to the processing steps enumerated in the paragraph above. Thus the numeral 1 depicts the processing step of depositing the layer 21 of thick-film dielectric paste. The numeral 2 depicts the processing step of depositing the layer 22 of photoresist. The numeral 3 depicts the step of exposing with UV light through the openings 24 of the photolithography mask 23. The numeral 4 depicts the processing step of developing the pattern whereby the photoresist material and the dielectric are removed to form the voids 25 and 26 of the dielectric stencil. These voids when filled with conductive paste become the x-conductor lines 27 and 28 depicted by numeral 5. Numeral 6 depicts the cofiring of the conductive paste and the dielectric paste. During this firing all the organic resins are pyrolyzed and decomposed. FIG. 5 is similar to FIG. 4 but also shows the second dielectric layer 31 containing the vias 36 formed with mask 33 for interconnecting the different layers of conductive lines. The process steps are the same as for FIG. 4. FIG. 6 is similar to FIGS. 4 and 5 but in addition adds the third dielectric layer 41 which contains the y-conductor lines. The process steps are the same as for FIG. 4.

The embodiments of the invention in which an exclusive property or right is claimed are defined as follows:

1. A process for fabricating dielectric stenciled microcircuits comprising the steps of:

coating an insulating dielectric paste and photopatterning means over the surface of a substrate;

selectively exposing through a photolithography mask the substrate coating to light;

removing the exposed dielectric paste in the areas where the conductive circuit lines are to be located, thereby forming a dielectric stencil with voids;

filling the dielectric stencil voids with thick-film conductive paste to form the conductive lines; and, cofiring the dielectric paste and the conductive paste.

2. The process according to claim 1 wherein the cofiring is in a nitrogen atmosphere at a temperature range of about 800° C. to about 1000° C.

3. The process according to claim 1 wherein the cofiring is in an air atmosphere at a temperature range of about 800° C. to about 1000° C.

4. The process according to claim 3 wherein the thick film conductive paste is a noble metal.

5. The process according to claim 2 wherein the thick film conductive paste is a base metal.

6. The process according to claim 5 wherein the base metal is copper.

7. The process according to claim 1 wherein the photopatterning means of the coating is a constituent of the dielectric paste.

8. The process according to claim 1 wherein the photopatterning means of the coating is a layer of photoresist deposited over the dielectric paste.

9. A process for fabricating dielectric stenciled microcircuits comprising the steps of:

depositing a layer of an insulating dielectric paste over the surface of a substrate and drying the dielectric paste layer;

depositing a layer of photoresist over the insulating dielectric paste and drying the photoresist layer;

selectively exposing through a photolithography mask the photoresist layer to light;

removing the photoresist and dielectric layer where the conductive circuit lines are to be, thereby forming a dielectric stencil with voids;

filling the dielectric stencil voids with thick-film conductive paste to form the conductive lines; and, cofiring the dielectric layer and the conductive paste.

10. The process according to claim 9 wherein the cofiring is in a nitrogen atmosphere at a temperature range of about 800° C. to about 1000° C.

11. The process according to claim 9 wherein the cofiring is in an air atmosphere at a temperature range of about 800° C. to about 1000° C.

12. The process according to claim 11 wherein the thick film conductive paste is a noble metal.

13. The process according to claim 10 wherein the thick film conductive paste is a base metal.

14. The process according to claim 13 wherein the base metal is copper.

* * * * *